United States Patent
Reuter et al.

(10) Patent No.: US 10,516,207 B2
(45) Date of Patent: Dec. 24, 2019

(54) HIGH FREQUENCY SYSTEM, COMMUNICATION LINK

(71) Applicant: NXP B.V., Eindhoven (NL)

(72) Inventors: Ralf Reuter, Landshut (DE); Ziqiang Tong, Ottobrunn (DE)

(73) Assignee: NXP B.V., Eindhoven (NL)

( * ) Notice: Subject to any disclaimer, the term of this patent is extended or adjusted under 35 U.S.C. 154(b) by 89 days.

(21) Appl. No.: 15/597,532

(22) Filed: May 17, 2017

(65) Prior Publication Data

US 2018/0337448 A1 Nov. 22, 2018

(51) Int. Cl.
*H01Q 1/52* (2006.01)
*H01Q 1/22* (2006.01)
*H01Q 5/307* (2015.01)
*H01Q 21/28* (2006.01)
*H01Q 1/38* (2006.01)

(52) U.S. Cl.
CPC ........... *H01Q 1/523* (2013.01); *H01Q 1/2283* (2013.01); *H01Q 1/38* (2013.01); *H01Q 5/307* (2015.01); *H01Q 21/28* (2013.01); *H01L 2224/16225* (2013.01)

(58) Field of Classification Search
CPC .......... H01Q 1/2283; H01Q 1/38; H01Q 1/52; H01Q 1/523; H01Q 5/30; H01Q 5/307; H01Q 5/342; H01Q 5/35; H01Q 23/00
See application file for complete search history.

(56) References Cited

U.S. PATENT DOCUMENTS

| | | | |
|---|---|---|---|
| 5,892,256 A | 4/1999 | Matsushita et al. | |
| 6,154,176 A | 11/2000 | Fathy et al. | |
| 6,297,551 B1 | 10/2001 | Dudderar et al. | |
| 6,713,685 B1 | 3/2004 | Cotton | |
| 7,752,911 B2 | 7/2010 | Schultheiss | |
| 7,908,420 B2 * | 3/2011 | Rofougaran | H01Q 1/2283 375/222 |

(Continued)

FOREIGN PATENT DOCUMENTS

| | | |
|---|---|---|
| CN | 1317163 A | 10/2001 |
| EP | 1 127 387 B1 | 1/2007 |

(Continued)

OTHER PUBLICATIONS

Hasch et al. "Millimeter-Wave Technology for Automotive Radar Sensors in the 77 GHz Frequency Band", IEEE Transactions on Microwave Theory and Techniques, vol. 60, No. 3, pp. 845-860 (Mar. 2012).

*Primary Examiner* — Daniel Munoz
*Assistant Examiner* — Patrick R Holecek
(74) *Attorney, Agent, or Firm* — Rajeev Madnawat

(57) ABSTRACT

A device is disclosed. The device includes a wire board including metallic wiring and a first microchip connected to the metallic wiring. The first microchip includes a first radiating element configured to operate a first frequency. The device further includes a second microchip connect to the metallic wiring. The second microchip includes a second radiating element configured to operate at the first frequency. A main radiating element is also included. The main radiating element is configured to operate at a second radio frequency. The first microchip and the second microchip are physically placed such that the first radiating element faces the second radiating element.

17 Claims, 3 Drawing Sheets

(56) References Cited

U.S. PATENT DOCUMENTS

| | | | |
|---|---|---|---|
| 7,974,587 B2* | 7/2011 | Rofougaran | H01L 23/552 |
| | | | 235/492 |
| 8,293,588 B2 | 10/2012 | Tang | |
| 2004/0018599 A1 | 6/2004 | Chason et al. | |
| 2005/0156789 A1 | 7/2005 | Mohamadi | |
| 2008/0293446 A1 | 11/2008 | Rofougaran | |
| 2009/0015485 A1 | 1/2009 | Floyd et al. | |
| 2009/0091506 A1 | 4/2009 | Navarro et al. | |
| 2009/0237255 A1 | 9/2009 | Rofougaran | |
| 2010/0141350 A1 | 6/2010 | Sasaki et al. | |
| 2010/0193935 A1 | 8/2010 | Lachner et al. | |
| 2010/0231332 A1 | 9/2010 | Sugimoto et al. | |
| 2012/0013499 A1 | 1/2012 | Hayata | |
| 2012/0104574 A1 | 5/2012 | Boeck et al. | |
| 2012/0252522 A1 | 10/2012 | Uchida et al. | |
| 2012/0263244 A1 | 10/2012 | Kyles et al. | |
| 2015/0325908 A1* | 11/2015 | Reuter | H01L 23/66 |
| | | | 343/700 MS |

FOREIGN PATENT DOCUMENTS

| | | |
|---|---|---|
| JP | 57028401 A | 2/1982 |
| JP | 2009-141386 A | 6/2009 |
| KR | 20000017029 A | 3/2000 |

\* cited by examiner

HIGH FREQUENCY SYSTEM, COMMUNICATION LINK

BACKGROUND

High frequency (HF) electromagnetic wave emitting or receiving devices may be provided in form of one or more integrated circuits. The integrated circuits may be arranged on a wiring board, e.g., a printed circuit board (PCB). An emission or a reception antenna that is suitably coupled to the integrated circuits may be arranged on the wiring board or be integrated therein. The wiring board may comprise one or more conductive layers and one or more isolating layers arranged atop each other in an alternating manner so that there is an isolating layer between each pair of adjacent conductive layers. Various electronic components such as conductors, capacitors, inductors, or microstrip lines may be integrated in the conductive layers.

FIG. 1 illustrates at least a part of a typical PCB 100 including two microchips 104, 106. The first microchip 104 is connected to the second microchip 106 through a metallic wire 108. The empty space on the PCB 100 may be covered with a metallic layer 112 which may help reduce radio frequency (RF) interference. In some applications, a high frequency signal needs to be transmitted from the first microchip 104 to the second microchip 106 and this transmission is effectuated using the connecting wire 108. An example of this communication may be a distribution of local oscillator (LO) signals. The PCB 100 may also include radiating elements 110 to enable a system assembled on the PCB 100 to communicate with external system or systems wirelessly.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

In one embodiment a device is disclosed. The device includes a wire board including metallic wiring and a first microchip connected to the metallic wiring. The first microchip includes a first radiating element configured to operate a first frequency. The device further includes a second microchip connect to the metallic wiring. The second microchip includes a second radiating element configured to operate at the first frequency. A main radiating element is also included. The main radiating element is configured to operate at a second radio frequency. The first microchip and the second microchip are physically placed such that the first radiating element faces the second radiating element.

In another embodiment, a device is disclosed that includes a first wire board including a first metallic wiring and a second wire board including a second metallic wiring. The second wire board is not connected to the first wire board using metallic wires. The first wire board includes a first microchip connected to the first metallic wiring and the first microchip includes a first radiating element configured to operate a first frequency. The second wire board includes a second microchip connect to the second metallic wiring and the second microchip includes a second radiating element configured to operate at the first frequency. The second wire board further includes a main radiating element that is configured to operate at a second radio frequency. The first wire board and the second wire board are physically placed such that the first radiating element faces the second radiating element.

In some embodiments, there is no physical obstacle between the first radiating element and the second radiating element and the first frequency is higher than the second frequency. The first frequency is N times greater than the second frequency, where N is an integer. The value of N may be selected from 2 to 10. In some embodiments, the value of N may be predetermined based on tests to minimize an interference between a signal having the first frequency and a signal having the second frequency.

In some embodiments, the first microchip is not connected to the second microchip using a metallic wire. However, in some other embodiments, the first microchip is connected to the second microchip using a metallic wire for low frequency communication. The wire board has a top side and an underside and the underside faces an opposing direction and the main radiating element is located on the underside while the first microchip is located on the top side.

In some other embodiments, the wire board has a top side and an underside and the underside faces an opposing direction and wherein the main radiating element are located on the top side a connector array on the underside. The second microchip includes a third radiating element that is placed and configured to communicate with the main radiating element through a hole in the wire board.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments. Advantages of the subject matter claimed will become apparent to those skilled in the art upon reading this description in conjunction with the accompanying drawings, in which like reference numerals have been used to designate like elements, and in which:

Note that figures are not drawn to scale. Intermediate steps between figure transitions have been omitted so as not to obfuscate the disclosure. Those intermediate steps are known to a person skilled in the art.

DETAILED DESCRIPTION

Many well-known manufacturing steps, components, and connectors have been omitted or not described in details in the description so as not to obfuscate the present disclosure.

Figure 2:
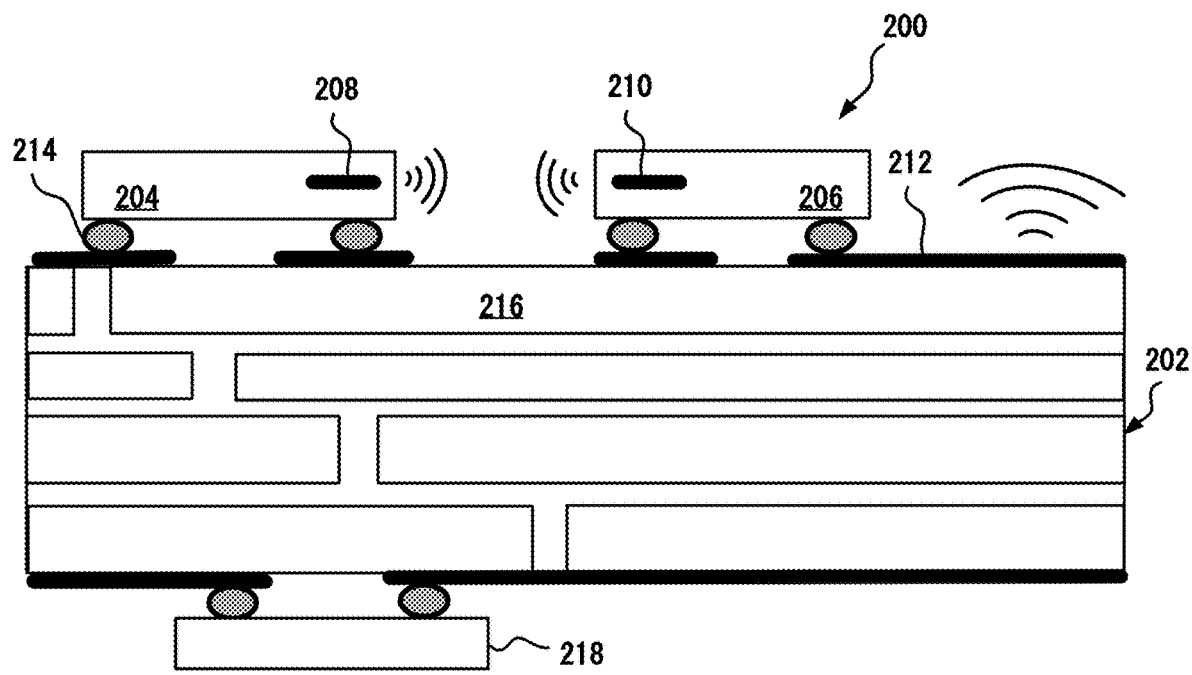
FIGS. 2, 3, 4 and 5 depict, in various embodiments, a cross section of a PCB including microchips with radiating elements and arranged on the PCB to communicate with each other wirelessly in accordance with one or more embodiments of the present disclosure.

FIG. 2 illustrates a cross section of a part of a printed circuit board or wiring board 202 of a device 200. The PCB 202 may be a multilayer structure having layers of conducting material isolated by non-conducting material. Toward the top, the PCB 202 may be at least partially covered by a material that helps reduce interference in a radio frequency (RF) communication. On the top surface of the PCB 202, there may be conducting wirings to interconnect microchips and other electronic components. A first microchip 204 and a second microchip 206 are shown to be connected to the conducting wiring through bond wires, interconnects or solder balls 214. The first microchip 204 and the second microchip 206 are shown to be Wafer Level Chip Scale Packaging (WLCSP) or Embedded Wafer Level Ball (eWLB) packaging. However, in other embodiments, conventional microchips with a plurality of pins may also be used. The first microchip 204 including a first radiating element 208 and the second microchip 206 includes a second radiating element 210. A radiating element is a small antenna that can transmit and receive radio signals. The first microchip 204 and the second microchip 206 include signal transmitters and receivers coupled to the radiating elements 208 and 210 respectively.

Additionally, in some embodiments, the first microchip 204 may be connected to the second microchip 206 using a metallic wiring. If so connected, the wired connection is not used for high frequency transmission in the range greater than 500 megahertz, for example. In an embodiment, a wired connection is not used for a signal with a frequency at which a transmission through a wired connection causes an amount of parasitic radiation that interferes with the operations of the system 200 thus reducing the performance of the system 200. Instead, those high frequency signals are transmitted from the first microchip 204 to the second microchip 206 (or vice versa) wirelessly through the radiating elements 208, 210. The first microchip 204 and the second microchip 206 are oriented and placed on the PCB 202 such a way that the radiating elements 208, 210 align and there are no physical obstructions between them. In some embodiments, the communication through the radiant elements 208, 210 may be used for local oscillator (LO) distribution for clock synchronizing the first microchip 204 and the second microchip 206. In some embodiments, the frequency of the LO signal may be in the giga hertz range in applications such as radar sensors. A main radiating element or elements 212 may be fabricated using standard PCB manufacturing methods and the main radiating element 212 is used for transmitting or receiving signals from external devices. For example, the radiating element 212 may be used for sensing radar signals if the device 200 is a radar sensor. A person skilled in the art, however, would appreciate that the embodiments described herein may be used in other high frequency applications.

In some embodiments, the radiating elements 208, 210 may be of vivaldi antenna class or type. A Vivaldi antenna is a co-planar broadband-antenna, which may be made from a dielectric plate metalized on both sides. The radiating elements 208, 210 can be made for linear polarized waves or using two devices arranged in orthogonal direction for transmitting or receiving both polarization orientations. The radiating elements may be fed with 90-degree phase-shifted signals to transmit/receive circular-oriented electromagnetic waves.

In some embodiments, the PCB 202 may be double sided, that is, the PCB 202 includes active components on both sides. A use of double sided PCBs may help reduce overall device size. Alternatively, an array of connectors may be provided on the underside of the PCB 202. The connectors may be electrically connected to the top side of the PCB 202 through metallic interconnect fabricated through the thickness of the PCB 202. In some embodiments, high frequency circuitry may be placed on one side and low frequency circuitry on the other side to reduce interference. In one embodiment, a ball grid array 218 may be included on the underside of the PCB 202. The ball grid array 218 is designed to enable high density connections to be made more easily to integrated circuits by allowing the underside of a chip package to be used for the connectivity with other devices or systems.

It may be noted that the carrier frequency at which the radiating elements 208, 210 operate may be in the whole positive multiples of the operating frequency of the main radiating element 212. Hence, if the main radiating element 212 operates at the frequency $f_x$ then the radiating elements 208, 210 may be configured to operate at the frequency $N \times f_x$, where N is an integer. Using a greater frequency cause no impact of the transmission pattern of the main radiating element 212. Further, the use of higher frequencies for the microchip to microchip communication does not cause spurious signals.

Figure 3:
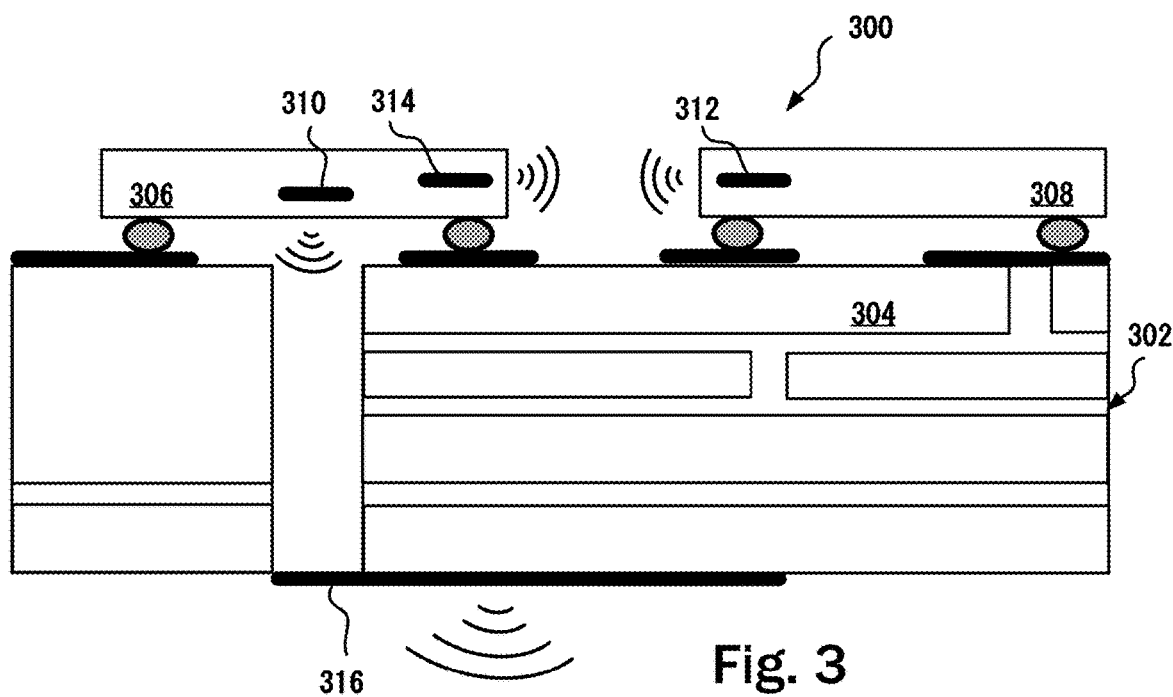

FIG. 3 shows a device 300 which employs a same or similar microchip to microchip commutation as described in FIG. 2. As depicted, the device 300 includes a PCB 302 (or a section thereof) that includes a top side and an underside. The PCB 302 may be a multi-layered circuit board having multiple metallic layers isolated by non-conducting layers and having interconnects to selectively electrically connect metallic layers. In this embodiment, a main radiating element 316 is incorporated on the underside. This arrangement effectively segregate radiating elements operating at different frequencies to reduce interference. The top side includes a microchip 308 that includes a first radiating element 312. The first microchip 308 is connected to other components (not shown) through solder balls or interconnect and a metallic layer of the top side of the PCB 302.

The top side of the PCB 302 also includes a second microchip 306 that includes a second radiating element 314 that is oriented to provide communication with the first microchip 308. The second microchip 306 further includes a third radiating element 310 that is oriented to transmit signals towards the underside of the PCB 302. A hole is formed in the PCB 302 through its entire width. The second microchip 306 is placed on the top side such that the third radiating element 310 is located directly above the hole. In one embodiment, on the underside the hole is covered either fully or partially by the main radiating element 316. In another embodiment, another microchip with a radiating element may be placed on the hole on the underside. This microchip can receive signals from the third radiating element 310 transmit the received signals externally using the main radiating element 316. Contrary to the embodiment of FIG. 2 in which the second microchip 206 is connected to the main radiating element 212 through a wire, in this embodiment, a microchip to main radiating element communication is also wireless. The size of the main radiating element 316 may depend of its operating frequency. Lower operating frequencies may require larger radiating elements. Therefore, having the main radiating element on the underside may provide greater design choices and compact devices operating at different frequencies because the underside may provide greater surface area for fabricating a bigger main radiating element 316.

Figure 4:
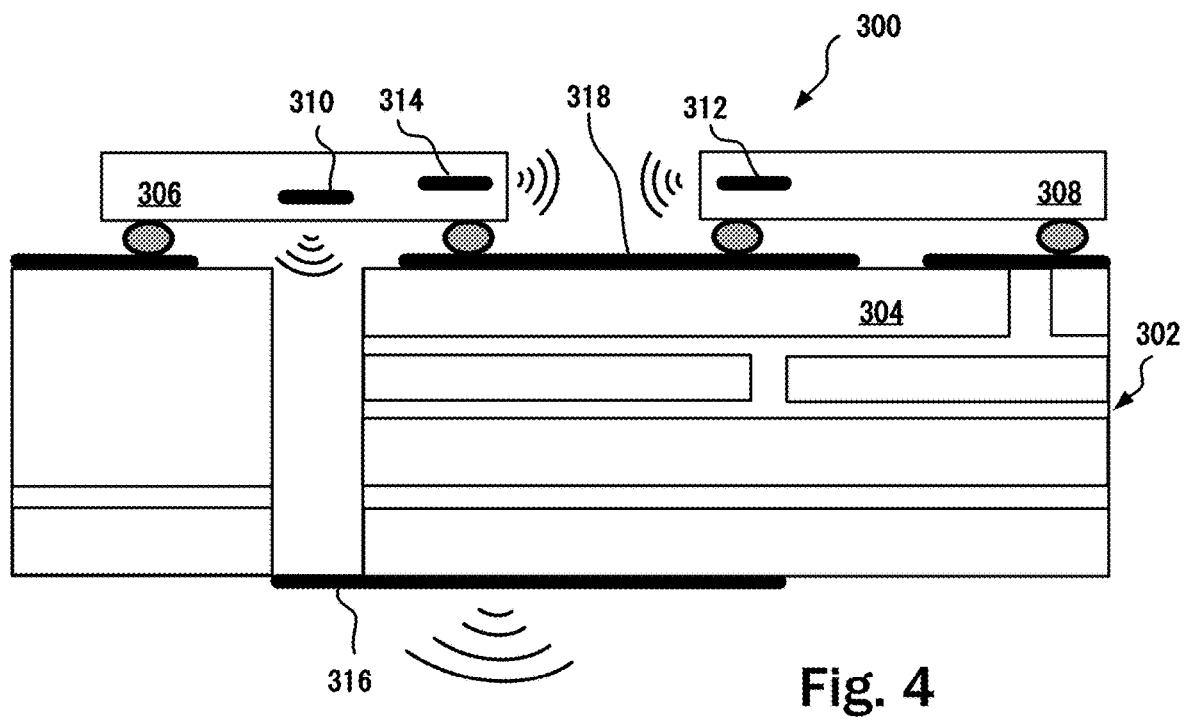

FIG. 4 depicts the device 300 of FIG. 3 in a different embodiment in which the first microchip 308 and the second microchip 306 are configured to communicate both wirelessly, as described above, as well as using a metallic wire 318. As described above, high frequency communication may be effectuated wirelessly and other communication may be performed through the metallic wire 318.

Figure 5:
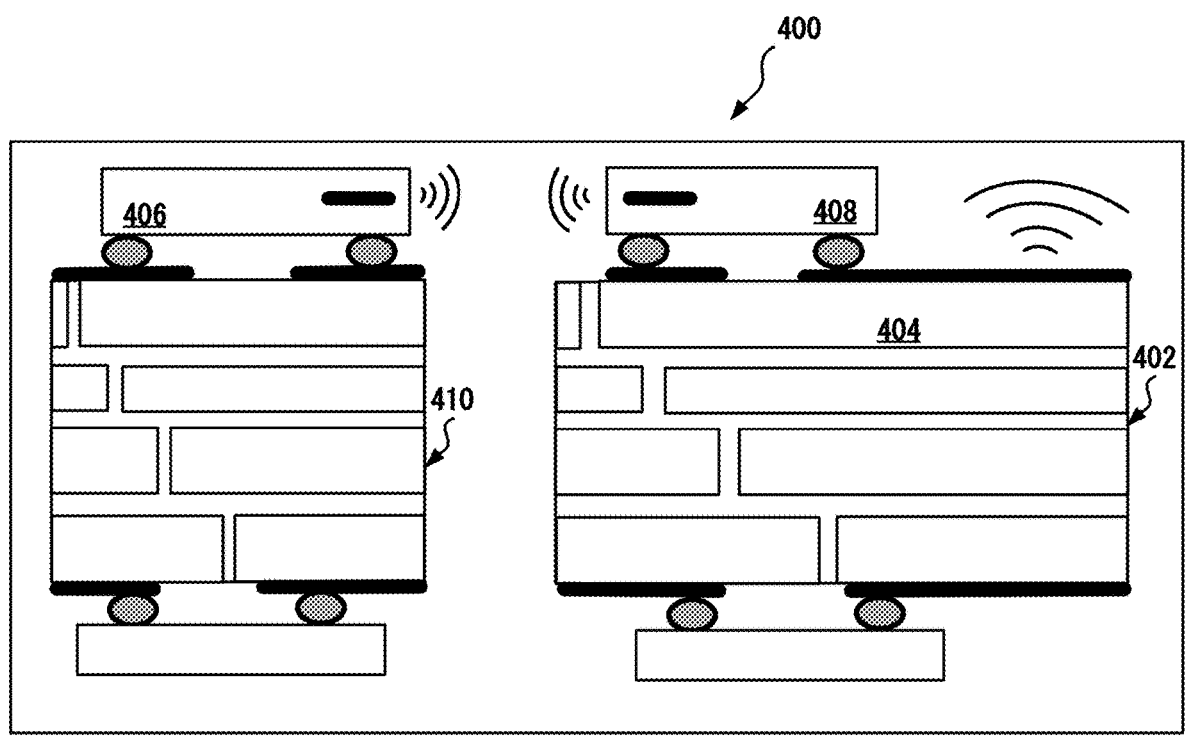

FIG. 5 discloses the device 400 that includes two separate PCBs, a first PCB 402 and a second PCB 410. The PCB 402 and the PCB 410 may not be connected to each other using any metallic wiring. The first PCB 402 includes a microchip 408 and the second PCB 410 includes a second microchip 406. The first microchip 408 includes a first radiating element and similarly the second microchip 406 includes a second radiating element. In the device 400, the PCB 402 and the PCB 410 may be oriented such that the first radiating element and the second radiating element faces each other and configured to transmit and receive signals. This embodiment provides a greater device design flexibility and is advantageous because the subsystems fabricated on both PCBs may be designed and manufactured separately and then may be easily assembled to form the device 400. This embodiment may be employed in radar application. The distance between the first radiating element and the second radiating element be in tens of multiples of the wavelength of the operating frequency of the two radiating elements.

Figure 1:
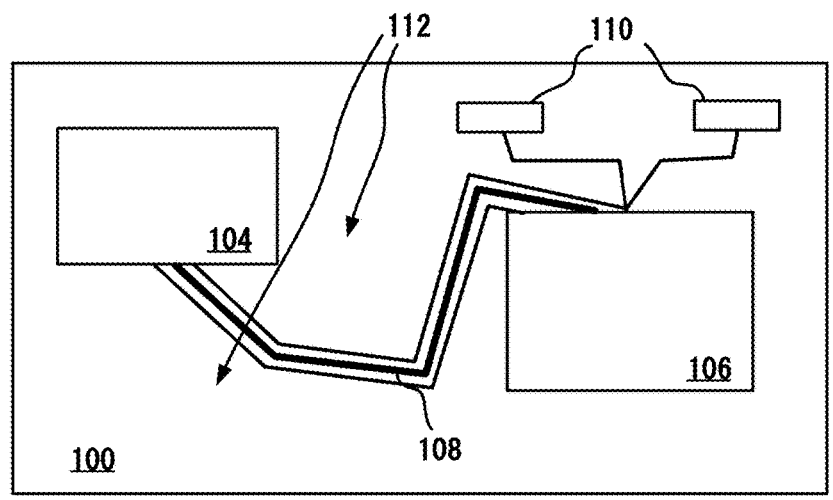
FIG. 1 shows a layout of a typical printed circuit board (PCB) or wiring board.

Since the embodiments described herein do not use an interconnect 108 such as shown in FIG. 1, more compact devices can be designed because of a relative of ease of placement of the microchips 204, 206 on the PCB 202.

Some or all of these embodiments may be combined, some may be omitted altogether, and additional process steps can be added while still achieving the products described herein. Thus, the subject matter described herein can be embodied in many different variations, and all such variations are contemplated to be within the scope of what is claimed.

While one or more implementations have been described by way of example and in terms of the specific embodiments, it is to be understood that one or more implementations are not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

The use of the terms "a" and "an" and "the" and similar referents in the context of describing the subject matter (particularly in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. Furthermore, the foregoing description is for the purpose of illustration only, and not for the purpose of limitation, as the scope of protection sought is defined by the claims as set forth hereinafter together with any equivalents thereof entitled to. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the invention as claimed.

Preferred embodiments are described herein, including the best mode known to the inventor for carrying out the claimed subject matter. Of course, variations of those preferred embodiments will become apparent to those of ordinary skill in the art upon reading the foregoing description. The inventor expects skilled artisans to employ such variations as appropriate, and the inventor intends for the claimed subject matter to be practiced otherwise than as specifically described herein. Accordingly, this claimed subject matter includes all modifications and equivalents of the subject matter recited in the claims appended hereto as permitted by applicable law. Moreover, any combination of the above-described elements in all possible variations thereof is encompassed unless otherwise indicated herein or otherwise clearly contradicted by context.

What is claimed is:

1. A device, comprising:
a wire board including metallic wiring;
a first microchip connected to the metallic wiring, wherein the first microchip includes a first radiating element configured to operate at a first frequency and a secondary radiating element configured to operate at a second frequency;
a second microchip connected to the metallic wiring, wherein the second microchip includes a second radiating element configured to operate at the first frequency and wirelessly communicate with the first radiating element of the first microchip;
a main radiating element that is configured to operate at the second frequency and wirelessly communicate with the secondary radiating element of the first microchip, wherein the first microchip and the second microchip are physically placed such that the first radiating element faces the second radiating element.

2. The device of claim 1, wherein there is no physical obstacle between the first radiating element and the second radiating element.

3. The device of claim 1, wherein the first frequency is higher than the second frequency.

4. The device of claim 1, wherein the first frequency is N times greater than the second frequency, where N is an integer.

5. The device of claim 4, wherein a value of N may be predetermined based on tests to minimize an interference between a signal having the first frequency and a signal having the second frequency.

6. The device of claim 1, wherein the first microchip is not connected to the second microchip using a metallic wire.

7. The device of claim 1, wherein the first microchip is connected to the second microchip using a metallic wire for low frequency communication.

8. The device of claim 1, wherein the wire board has a top side and an opposite underside, the main radiating element is located on the underside, and the first microchip is located on the top side.

9. The device of claim 1, wherein the wire board has a top side and an opposite underside and the main radiating element is located on the top side.

10. The device of claim 8, wherein the second microchip includes a third radiating element that is placed and configured to communicate with the main radiating element through a hole through a thickness of the wire board.

11. The device of claim 9, wherein the wire board includes a connector array on the underside.

12. A device, comprising:
a first wire board including a first metallic wiring, wherein the first wire board includes a first microchip connected to the first metallic wiring that includes a first radiating element configured to operate at a first frequency and a secondary radiating element configured to operate at a second frequency;

a second wire board including a second metallic wiring, wherein the second wire board is not connected to the first wire board using metallic wires and includes a second microchip connected to the second metallic wiring that further includes:
- a second radiating element configured to operate at the first frequency and wirelessly communicate with the first radiating element of the first microchip, and
- a main radiating element that is configured to operate at the second frequency and wirelessly communicate with the secondary radiating element of the first microchip, wherein the first wire board and the second wire board are physically placed such that the first radiating element faces the second radiating element.

13. The device of claim 12, wherein there is no physical obstacle between the first radiating element and the second radiating element.

14. The device of claim 12, wherein the first frequency is higher than the second frequency.

15. The device of claim 12, wherein the first frequency is N times greater than the second frequency, where N is an integer.

16. The device of claim 15, wherein a value of N may be predetermined based on tests to minimize an interference between a signal having the first frequency and a signal having the second frequency.

17. A device, comprising:
- a wire board including a metallic wiring;
- a first microchip connected to the metallic wiring, wherein the first microchip includes a first radiating element configured to operate at a first frequency;
- a second microchip connect to the metallic wiring, wherein the second microchip includes a second radiating element configured to operate at the first frequency;
- a main radiating element that is configured to operate at a second radio frequency,
- wherein the first microchip and the second microchip are physically placed such that the first radiating element faces the second radiating element, wherein the first microchip and the second microchip both communicate wirelessly and through a metallic wire.

* * * * *